(12) United States Patent
Song et al.

(10) Patent No.: US 6,713,310 B2
(45) Date of Patent: Mar. 30, 2004

(54) FERROELECTRIC MEMORY DEVICE USING VIA ETCH-STOP LAYER AND METHOD FOR MANUFACTURING THE SAME

(75) Inventors: Yoon-Jong Song, Seoul (KR); Ki-Nam Kim, Kyungki-do (KR); Sang-Woo Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/354,651

(22) Filed: Jan. 29, 2003

(65) Prior Publication Data

US 2003/0170919 A1 Sep. 11, 2003

(30) Foreign Application Priority Data

Mar. 8, 2002 (KR) .......................... 2002-12563
Oct. 25, 2002 (KR) .................... 10-2002-0065610

(51) Int. Cl.[7] ................................................. H01G 7/06
(52) U.S. Cl. ......................... 438/3; 438/240; 438/253
(58) Field of Search ........................... 438/3, 238–240, 438/253–256, 396–399

(56) References Cited

U.S. PATENT DOCUMENTS 6,600,185 B1 * 7/2003 Tani et al. ................. 257/296

* cited by examiner

Primary Examiner—H. Jey Tsai
(74) Attorney, Agent, or Firm—Marger Johnson & McCollom, P.C.

(57) ABSTRACT

A ferroelectric memory device and a method for manufacturing the same. The ferroelectric memory device comprises a lower interlayer insulating layer formed on a semiconductor substrate. The ferroelectric memory device further comprises at least two adjacent ferroelectric capacitors disposed on the lower interlayer insulating layer, an interlayer insulation layer formed over the ferroelectric capacitors, leaving a top surface of the ferroelectric capacitors exposed, a patterned via etch-stop layer formed on the interlayer insulation layer, leaving the top surface of the capacitors exposed, an upper interlayer insulating layer formed on the patterned via etch-stop layer, and a plate line commonly connected to the at least two adjacent ferroelectric capacitors. Thus, integration of the ferroelectric memory device can be substantially increased.

17 Claims, 11 Drawing Sheets

FERROELECTRIC MEMORY DEVICE USING VIA ETCH-STOP LAYER AND METHOD FOR MANUFACTURING THE SAME

This application claims priority from Korean Patent Application No. 2002-12563, filed on Mar. 8, 2002, and Korean Patent Application No. 2002-65610, filed on Oct. 25, 2002, the contents of which are incorporated herein by this reference in their entirety.

BACKGROUND OF THE INVENTION

1. Field of the Invention

The present invention relates to a semiconductor device, and more particularly, to a ferroelectric memory device including a ferroelectric capacitor and a method for manufacturing the same.

2. Description of the Related Art

Ferroelectric memory devices using a ferroelectric layer have recently been recognized as ideal memory devices for next generation electronic devices. Ferroelectric memory devices work by controlling a direction of polarization based on a direction of an applied electric field. A digital "0" or "1" is stored in the ferroelectric memory device according to a direction of remnant polarization remaining after the electric field is removed. These ferroelectric memory devices are characterized by high endurance, high speed (e.g., tens of nanoseconds), low driving voltage (e.g., less than 5V), and low power dissipation. However, in addition to these characteristics, the ferroelectric memory device must also be highly integrated to be useful as a memory product.

To achieve high integration of a ferroelectric memory device, the ferroelectric capacitor embodied in the 1 transistor/1 ferroelectric capacitor (1T/1C) cell structure of the memory device should be miniaturized and multiple wiring processes should be developed. Hot temperature retention as well as powerful writing and reading abilities (compared to Dynamic Random Access Memory (DRAM) and Static RAM (SRAM) devices) should also be provided. Miniaturization of the ferroelectric capacitor, in particular, is an important and complicated technology in improving the integration of the ferroelectric memory device. This is because changes in ferroelectricity due to reductions in size of ferroelectric capacitor regions should be studied and verified. Further, subsequent processes on smaller capacitors become more difficult. Via holes in each cell should be connected to plate lines to provide the desired characteristics of the ferroelectric memory device. The conventional method for manufacturing via holes in each cell is not usable in a capacitor region with a design rule of less than 0.25 $\mu$m.

Accordingly, there is a need for improved technology for forming via holes to connect plate lines to smaller capacitors. This technology should not damage the capacitor. Damage can occur due to etching chemicals (gas or solution) that impair the capacitor by degrading the remnant polarization or its distribution. Because the operation of a ferroelectric memory device relies on recognizing the difference between the remnant polarization of a reference cell capacitor and a memory cell capacitor, if the distribution of remnant polarization in the capacitors is irregular, it reduces the sensing margin of the ferroelectric memory device.

SUMMARY OF THE INVENTION

The present invention provides a more integrated ferroelectric memory device by improving the connection between plate lines and a ferroelectric capacitor.

The present invention also provides methods for manufacturing a ferroelectric memory device including methods for forming via holes in a highly integrated ferroelectric memory device, without degrading the characteristic of a capacitor.

According to one embodiment of the present invention, a ferroelectric memory device comprises a lower interlayer insulating layer formed on a semiconductor substrate. The ferroelectric memory device further comprises at least two adjacent ferroelectric capacitors disposed on the lower interlayer insulating layer, an interlayer insulation layer formed over the ferroelectric capacitors, leaving a top surface of the ferroelectric capacitors exposed, a patterned via etch-stop layer formed on the interlayer insulation layer, leaving the top surface of the capacitors exposed, an upper interlayer insulating layer formed on the patterned via etch-stop layer, and a plate line commonly connected to the at least two adjacent ferroelectric capacitors.

According to another embodiment of the present invention, a ferroelectric memory device comprises a lower interlayer insulating layer formed on a semiconductor substrate. The ferroelectric memory device further comprises at least two adjacent ferroelectric capacitors disposed on the lower interlayer insulating layer, an interlayer insulation layer formed between the ferroelectric capacitors and extending to substantially the same height as the ferroelectric capacitors, leaving a top surface of the capacitors exposed, a patterned via etch-stop layer formed on the interlayer insulation layer, leaving a top surface of the interlayer insulation layer exposed, an upper interlayer insulating layer formed on the patterned via etch-stop layer, and a plate line commonly connected to at least two adjacent ferroelectric capacitors.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
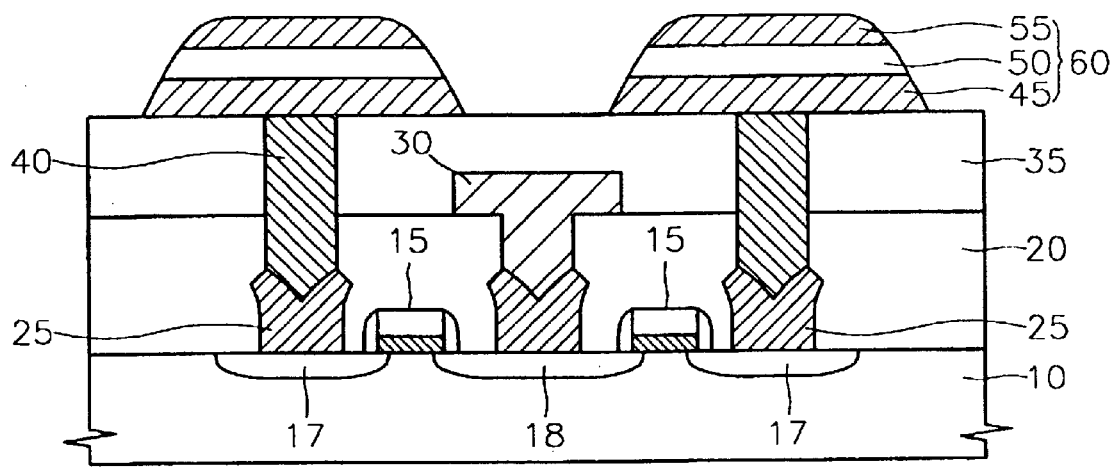
FIGS. 1 through 9 are cross-sectional views of a ferroelectric memory device and a method for manufacturing the same according to an embodiment of the present invention.

The present invention now will be described more fully with reference to the accompanying drawings. It should be noted, however, that the present invention may be embodied in many different forms and should not be construed as being limited to the specific embodiments set forth herein. Rather, these embodiments are provided by way of example only.

It should also be understood that when a layer is referred to as being "on" another layer or a substrate, it can be directly on the other layer or the substrate, or interlayer layers may also be present. In the accompanying drawings, the thickness of layers and regions may be exaggerated for clarity. Also, the same reference numerals in different drawings represent the same or like elements.

Figure 9:
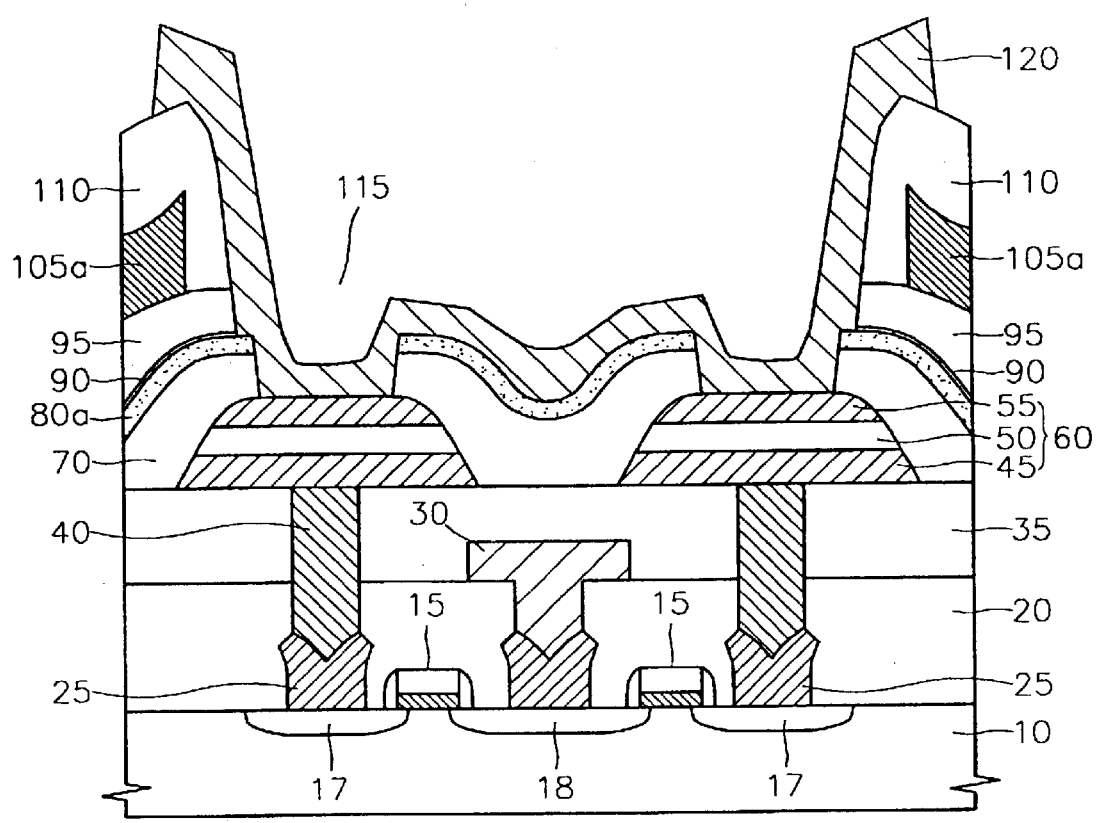

FIG. 9 is a cross-sectional view of a ferroelectric memory device according to an embodiment of the present invention. According to this embodiment, cell transistors are disposed on the semiconductor substrate in a two-dimensional array of perpendicular rows and columns.

Referring to FIG. 9, a plurality of cell transistors are formed on a semiconductor substrate 10 on which an isolation process has been completed. Each cell transistor includes a gate 15 and a source region 17 and a drain region 18 arranged on opposite sides of the gate 15. Contact pads 25 are formed on top of the source and drain regions 17, 18. A bit line 30 is electrically connected to the drain region 18 of the cell transistors through a first lower interlayer insulating layer 20 via the contact pad 25. A second lower interlayer insulating layer 35 is also formed. Contact plugs 40 are formed on top of the drain region 18 and pass through the second lower interlayer insulating layer 35 and the first lower interlayer insulating layer 20. The contact plugs 40 are electrically connected to the source regions 17 of the cell transistors via the contact pads 25. The contact pads 25 may be formed when the aspect ratio of each contact hole for forming the bit line 30 and the contact plug 40, is large. The contact pads 25 may be omitted. Ferroelectric capacitors 60 are formed on top of the contact plugs 40. The cell transistors and contact plugs 40 are disposed in a two-dimensional array, and consequently, the ferroelectric capacitors 60 are also disposed in a two-dimensional array.

Each ferroelectric capacitor 60 includes a lower electrode 45, a ferroelectric layer pattern 50, and an upper electrode 55, which are sequentially stacked. The lower electrode 45 is located on top of the contact plug 40 and is electrically connected to the source region 17 through the contact plug 40. The lower electrode 45 may have multiple layers including an adhesive layer, a lower diffusion barrier layer, a lower metallic oxide layer, and a lower metallic layer. The total thickness of the lower electrode 45 can range from about 1000 to 3000 Å. The lower diffusion barrier layer is formed to prevent oxygen from diffusing. For example, the lower diffusion barrier layer comprises a high-melting point metal (e.g., TiN, Ti, TiAlN, TiSix, TiSi, TiSiN, TaSiN, TaAlN, Ir, Ru, W, or WSi), its silicide, or its nitride. The ferroelectric layer pattern 50 is made of a $Pb(Zr, Ti)O_3$ layer, a $SrBi_2Ta_2O_9$ layer or $SrBi(Ta, Nb)_2O_9$. In addition, the ferroelectric layer pattern 50 may be made of a $SrTiO_3$ layer, a $BaTiO_3$ layer, a $(Ba,Sr)TiO_3$ layer, a $(Pb,La)(Zr,Ti)O_3$ layer, or a $Bi_4Ti_3O_{12}$ layer. The upper electrode 55 can be a dual layer including an upper metallic oxide layer and an upper diffusion barrier layer. The total thickness of the upper electrode can also range from about 1000 to 3000 Å. The upper electrode 55 and the lower electrode 45 are preferably made of a metal such as Pt, Ir, Ru, Rh, Os, or Pd. Accordingly, corresponding metallic oxides such as $IrO_2$, $RhO_2$, or $RuO_2$ can be used for the upper electrode 55 and the lower electrode 45.

The upper electrode 55 of the ferroelectric capacitor 60 is exposed through an interlayer insulation layer 70 that covers the regions between the ferroelectric capacitors 60. The patterned via etch-stop layer 80a is preferably formed only on the interlayer insulation layer 70. An encapsulated barrier layer 90 is then preferably formed on top of the via etch-stop layer 80a. The encapsulated barrier layer 90 can be a metallic oxide layer such as an aluminum oxide layer, a titanium oxide layer, a zirconium oxide layer, a tantalum oxide layer, a silicon nitride layer, a cerium oxide layer or combinations thereof.

If hydrogen atoms permeate the ferroelectric layer pattern 50, they can reduce the reliability of the ferroelectric layer pattern 50 by reacting with oxygen atoms inside the ferroelectric layer pattern 50 and producing oxygen vacancies. Oxygen vacancies degrade the polarization characteristics of the ferroelectric capacitor. This can lead to the malfunction of the ferroelectric memory device. In addition, if hydrogen atoms spread in the interface between the ferroelectric layer pattern 50, the upper electrode 55, and the lower electrode 45, the energy barrier between them is lowered and leakage current characteristics of the ferroelectric capacitor become degraded. The encapsulated barrier layer 90 prevents hydrogen atoms generated during manufacture or included in a carrier gas from permeating the ferroelectric layer pattern 50. As a result, the encapsulated barrier layer 90 improves the characteristics and reliability of the ferroelectric capacitor 60.

The upper interlayer insulating layer is formed on the patterned via etch-stop layer 80a. The upper interlayer insulating layer includes the first upper interlayer insulating layer 95 and the second upper interlayer insulating layer 110. The patterned via etch-stop layer 80a is preferably formed of a material having a different etch selectivity from the interlayer insulation layer 70 and the upper interlayer insulating layer. For example, if the interlayer insulation layer 70 and the upper interlayer insulating layer are made of an oxide layer, the patterned via etch-stop layer 80a is preferably made of a titanium oxide layer, an aluminum oxide layer, a silicon nitride layer, a silicon oxynitride layer, or combinations thereof. A plurality of strapping lines 105a are formed between the first upper interlayer insulating layer 95 and the second upper interlayer insulating layer 110, thereby forming a first wiring.

A plurality of plate lines 120 for a second wiring are preferably formed in direct contact with at least two adjacent ferroelectric capacitors 60 through a slit-shaped common via hole 115 that passes through the second upper interlayer insulating layer, the first upper interlayer insulating layer, and the encapsulated barrier layer 90. The plate lines 120 contact the patterned via etch-stop layer 80a between the ferroelectric capacitors 60. Because the plate lines 120 and capacitors 60 are connected directly through the slit-shaped common via hole 115, the integration of the memory device is improved. A ferroelectric memory device constructed according to the foregoing principles can therefore be more highly integrated using the improved connecting structure between a plate line and a smaller capacitor according to reductions in a design rule.

Hereinafter, a method for manufacturing a ferroelectric memory device according to an embodiment of the present invention is described. FIGS. 1 through 8 are cross-sectional views showing a method for manufacturing a ferroelectric memory device shown in FIG. 9.

As shown in FIG. 1, a plurality of cell transistors are formed on the semiconductor substrate 10 after an isolation process. After forming a plurality of gates, a source region 17 and a drain region 18 are formed on the semiconductor substrate 10 arranged on opposite sides of each gate 15 by implanting impurities. A cell transistor, therefore, includes the gate 15, the source region 17 and the drain region 18 on the opposite sides of the gate 15. A conductive layer of the gate 15 can be made of doped polycrystalline silicon, tungsten (W), tungsten silicide (WSi), titanium silicide (TiSix), tantalum silicide (TaSix) or combinations thereof. Next, contact pads 25 are formed on the source region 17 and the drain region 18. The contact pads 25 can be formed of doped polycrystalline, silicon and can be formed self-aligned with the gate 15.

After forming the first lower interlayer insulating layer 20 on the semiconductor substrate 10, overlying the contact pads 25, a bit line 30 is formed to be electrically connected to the drain region 18 of the cell transistor through the first lower interlayer insulating layer 20 via the contact pads 25. The first lower interlayer insulating layer 20 can be made of, for example, BPSG (Boro Phospho Silicate Glass), and the bit line 30 can be made of, for example, tungsten. However, a person skilled in the art will appreciate that other suitable insulating materials can be used for forming the second lower interlayer insulating layer 35.

After forming the second lower interlayer insulating layer 35 on the semiconductor substrate 10, overlying the bit line 30, a plurality of contact plugs 40 are formed to be electrically connected to the source region 17 of the cell transistor through the second lower interlayer insulating layer 35 and the first lower interlayer insulating layer 20 via the contact pads 25. The second lower interlayer insulating layer 35 can also be made of BPSG, and the contact plugs 40 can be made of, for example, doped polycrystalline silicon.

In addition, a lower electrode layer, a ferroelectric layer and an upper electrode layer are sequentially formed on top of the second lower interlayer insulating layer 35 including the contact plugs 40. The lower electrode layer can be formed of multiple layers including an adhesive layer, a lower diffusion barrier layer, a lower metallic oxide layer and a lower metallic layer. The total thickness of the lower electrode layer can range between about 1000 and 3000 Å. The adhesive layer is formed to make a lower electrode in ohmic contact with the contact plugs 40. The adhesive layer can be formed by depositing a titanium layer to a thickness of about 100-500 Å using a sputtering process and then by oxidizing the titanium layer into a titanium oxide layer using conventional techniques such as thermal oxidation, for example, heat treating the titanium layer in a furnace using an oxygen ambient. The adhesive layer may be omitted.

It should be noted that the lower diffusion barrier layer is formed to prevent oxygen from diffusing. For example, the lower diffusion barrier layer can be formed by depositing a high-melting point metal (e.g., TiN, Ti, TiAlN, TiSix, TiSi, TiSiN, TaSiN, TaAlN, Ir, Ru, W, or WSi), its silicide, or its nitride using a physical vapor deposition (PVD), e.g., sputtering, chemical vapor deposition (CVD), or sol-gel process. When the adhesive layer is omitted, the lower diffusion barrier layer is in ohmic contact with the contact plugs 40. It is most preferable that the lower diffusion barrier be made of Ir with a low oxygen permeability to sufficiently prevent oxygen from diffusing. The upper electrode layer can be a dual layer including an upper metallic oxide layer, and an upper diffusion barrier layer. The total thickness thereof can range from about 1000 and 3000 Å. The upper diffusion barrier layer can be made of the same material as the lower diffusion barrier layer. The upper electrode and the lower electrode are made of a metal such as Pt, Ir, Ru, Rh, Os, Pd and the oxides thereof. For example, the lower electrode layer can be composed of Ir having a thickness of 1500 Å, $IrO_2$ having a thickness of about 500 Å, and Pt having a thickness of about 1500 Å. The upper electrode layer can be composed of Ir having a thickness of about 300 Å and $IrO_2$ having a thickness of about 1200 Å. These components of the lower and upper electrode layers can be formed using, for example, PVD.

The ferroelectric layer is made of a $Pb(Zr, Ti)O_3$ layer, a $SrBi_2Ta_2O_9$ layer or $SrBi(Ta, Nb)_2O_9$ using spin coating, or LSMCD (Liquid Source Mist Chemical Vapor Deposition), chemical vapor deposition (CVD) or physical vapor deposition (PVD). Preferably, when the ferroelectric layer is made of a $Pb(Zr,Ti)O_3$ layer, the $Pb(Zr,Ti)O_3$ layer is formed by performing crystallization heat treatment after a sol-gel process. In addition, the ferroelectric layer can be made of a $SrTiO_3$ layer, a $BaTiO_3$ layer, a $(Ba,Sr)TiO_3$ layer, a $(Pb,La)(Zr,Ti)O_3$ layer, or a $Bi_4Ti_3O_{12}$ layer.

A lower electrode layer, a ferroelectric layer and an upper electrode layer are patterned using a mask, to form a plurality of ferroelectric capacitors 60, in which a lower electrode layer 45, a ferroelectric layer pattern 50 and an upper electrode 55 are sequentially stacked. The ferroelectric capacitors 60 are formed on the contact plugs 40. Since the cell transistors are disposed in a two-dimensional array, therefore, the contact plugs 40 and the ferroelectric capacitors 60 are also disposed in a two-dimensional array.

It is not possible to etch using the existing three masks, because an overlay margin is considerably reduced in a highly integrated ferroelectric memory device. Instead, a capacitor node separation is performed by general photo etching using a single hard mask layer made of a titanium nitride layer and a photoresist.

Figure 2:
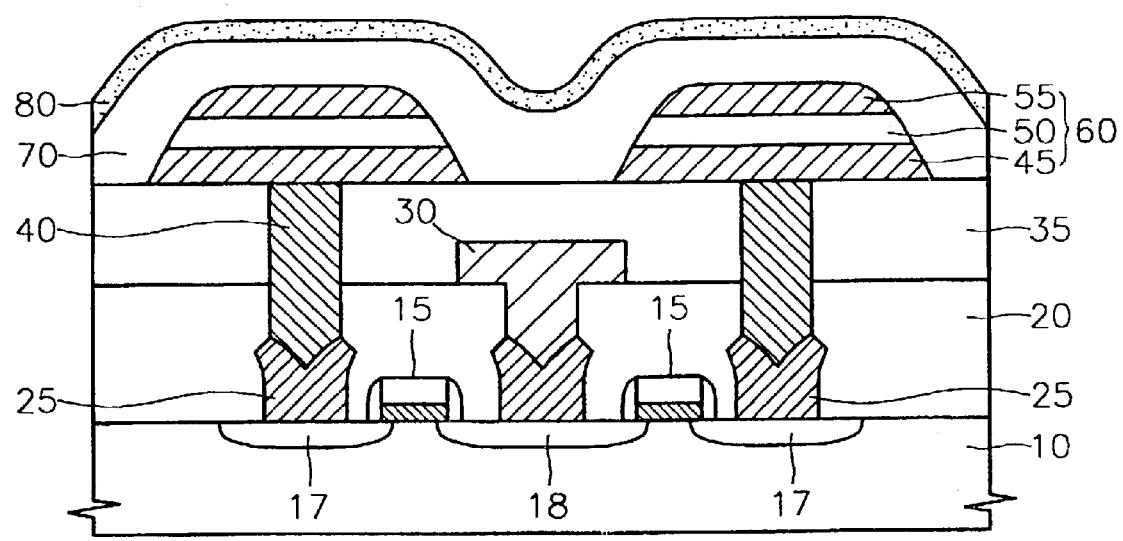

Next, as shown in FIG. 2, an interlayer insulation layer 70 covering the ferroelectric capacitor 60 is formed. A via etch-stop layer 80 is then formed on the interlayer insulation layer 70. The interlayer insulation layer 70 can be made of, for example, USG(Undoped Silicate Glass), PSG (Phosphorus Silicate Glass), PE-TEOS(Plasma Enhanced Tetra Ethyl Ortho Silicate Glass), or combinations of various insulation films. The via etch-stop layer 80 is made of a material having a different etch selectivity from the interlayer insulation layer 70 and comprises, for example, e a titanium oxide layer, an aluminum oxide layer, a silicon nitride layer, a silicon oxynitride layer, or combinations thereof.

Figure 3:
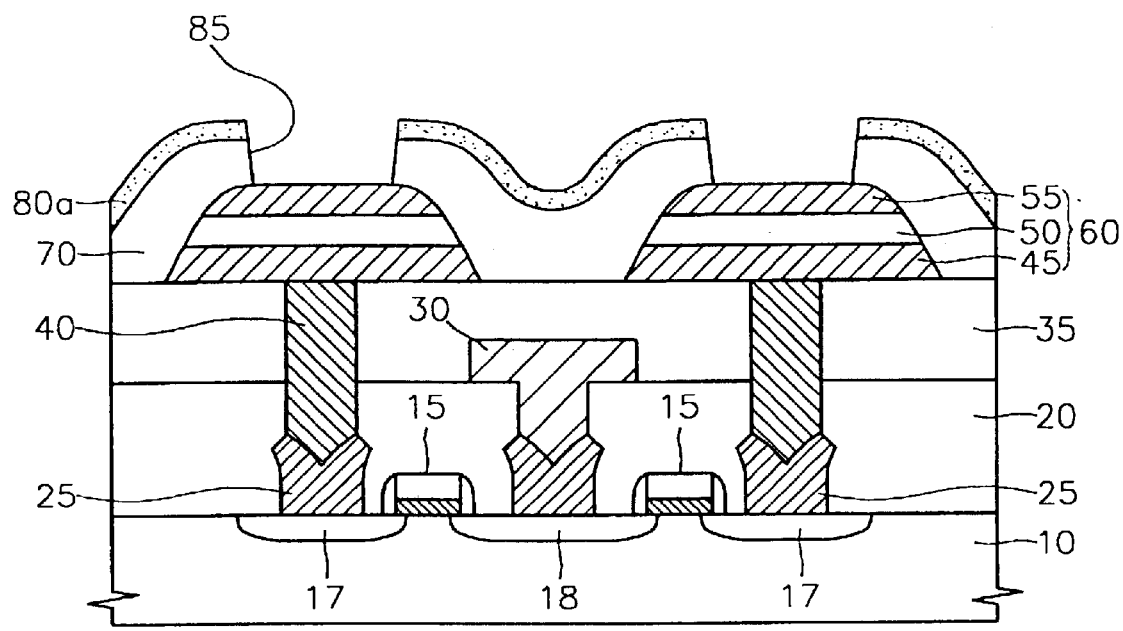

Referring to FIG. 3, the via etch-stop layer 80 and the interlayer insulation layer 70 are patterned in each cell, thereby forming cell via holes 85 exposing the upper electrodes 55. Reference numeral 80a denotes the patterned via etch-stop layer.

Figure 4:
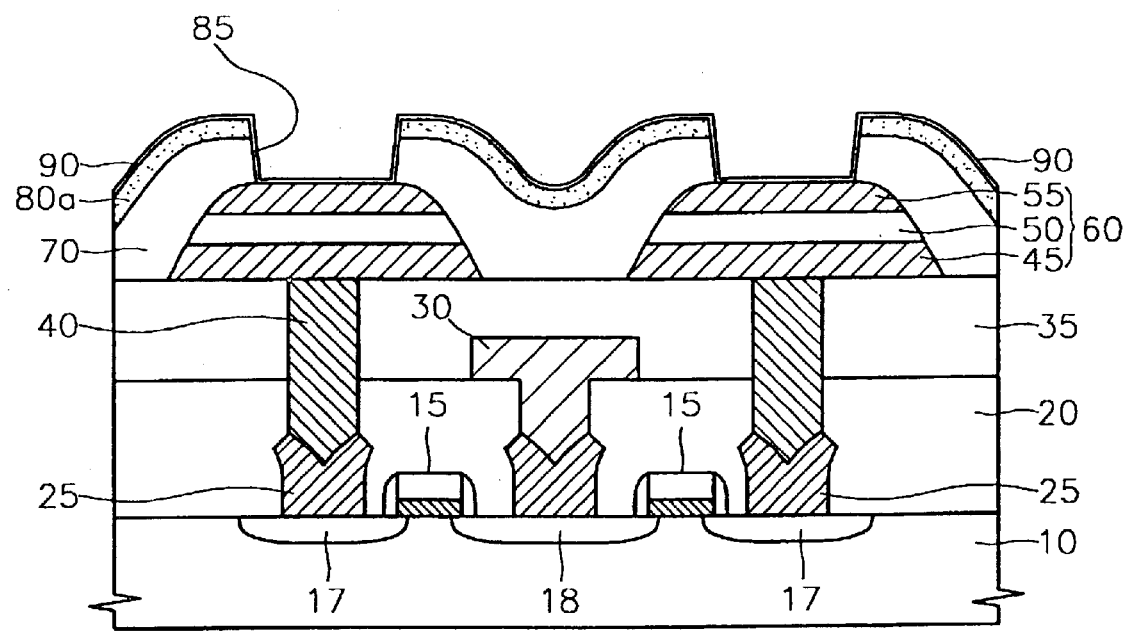

Next, as shown in FIG. 4, an encapsulating barrier layer 90 is formed on the patterned via etch-stop layer 80a to prevent hydrogen from permeating. The encapsulating barrier layer 90 can be, for example, an aluminium oxide layer, a titanium oxide layer, a zirconium oxide layer, a tantalum oxide layer, a silicon nitride layer, a cerium oxide layer, or combinations thereof.

Further, the encapsulating barrier layer 90 can prevent hydrogen atoms generated during semiconductor fabrication or included in a carrier gas from permeating through the ferroelectric layer pattern 50. As described above, hydrogen atoms should be excluded from the semiconductor devices as much as possible. This is because hydrogen diffuses into the ferroelectric capacitor layer pattern 50 through the upper electrode 55, thereby deoxidizing the oxidized substances in the ferroelectric layer pattern 50. As a result, the ferroelectric characteristics are degraded and adhesion to the upper electrode 55 of the ferroelectric layer pattern 50 is decreased due to changes in the chemical properties of the interface. The upper electrode 55 is elevated by by-products such as oxygen and water, which are produced in an oxidation-reduction reaction. The upper electrode 55 and the ferroelectric layer pattern 50 therefore easily liftoff at the interface. Accordingly, hydrogen atoms are excluded by the encapsulating barrier layer 90. The encapsulating barrier layer 90 can be formed by PVD using ion metal plasma (IMP) or collimate method, for example, to improve step coverage. Alternatively, the encapsulating barrier layer 90 can be formed by PE-CVD, LP (low pressure)-CVD, AP (atmospheric pressure)-CVD, or atomic layer deposition (ALD). In particular, since ALD can be performed at low temperature, the encapsulating barrier layer 90, which is physically and chemically stabilized, can be formed. Furthermore, because a single atomic layer can be repeatedly formed, it is possible to precisely control the thickness of the encapsulating barrier layer 90. Accordingly, the encapsulating barrier layer 90 can be formed to have step coverage of almost 100% regardless of the complexity of topology of an underlying structure.

Figure 5:
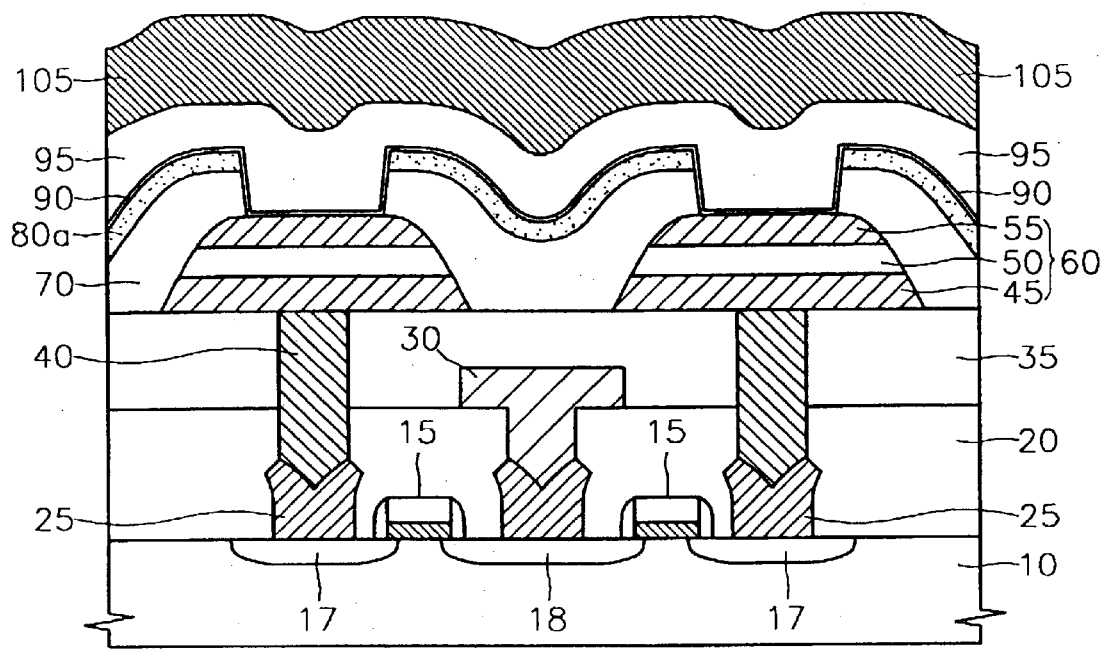

Referring to FIG. 5, a first upper interlayer insulating layer 95 is formed over the patterned via etch-stop layer 80a. The first upper interlayer insulating layer 95 fills the cell via hole 85. It is preferable that the first upper interlayer insulating layer 95 be made of another material having a different etch selectivity from the patterned via etch-stop layer 80a. If a titanium oxide layer, an aluminum oxide layer, a silicon nitride layer, a silicon oxynitride layer, or combinations thereof is used as the patterned via etch-stop layer 80a, an oxide layer can be used as the first upper interlayer insulating layer 95. For example, the first upper interlayer insulating layer 95 can be made of USG, PSG, or PE-TEOS. A conductive layer 105 is then formed on the first upper interlayer insulating layer 95. As the conductive layer 105, a layer of metal such as aluminium can be used.

Figure 6:
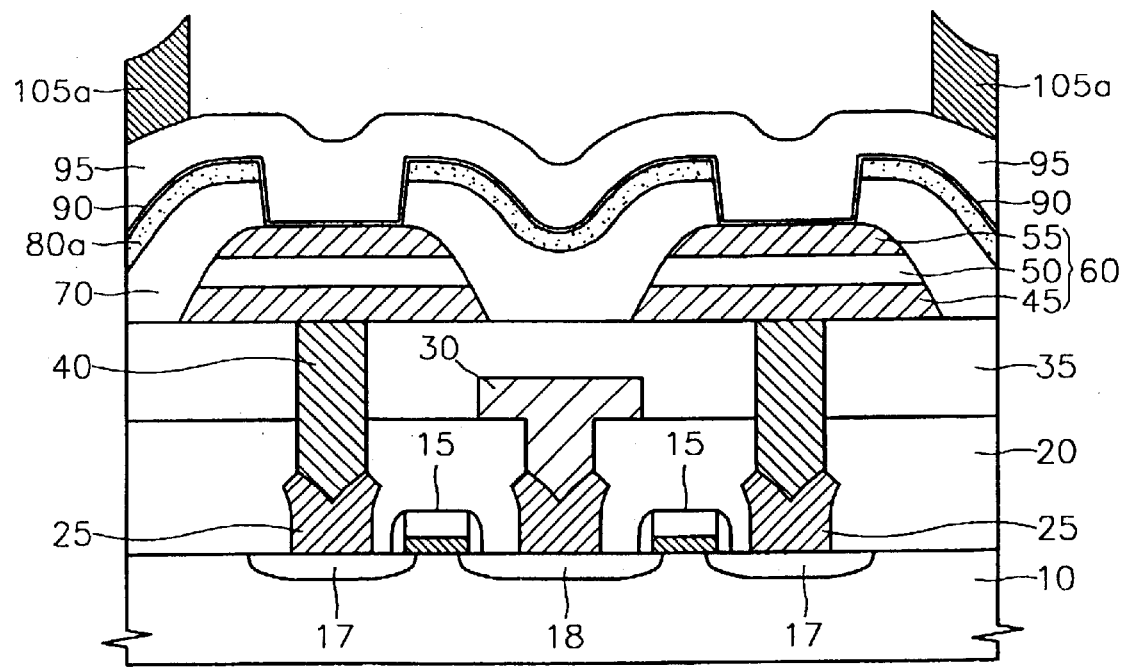

Referring to FIG. 6, strapping lines 105a are formed on the first upper interlayer insulating layer 95 by patterning the conductive layer 105. The strapping lines 105a are formed at opposite sides of two adjacent cell via holes 85 such that the two adjacent cell via holes 85 are disposed between the strapping lines 105a.

Figure 7:
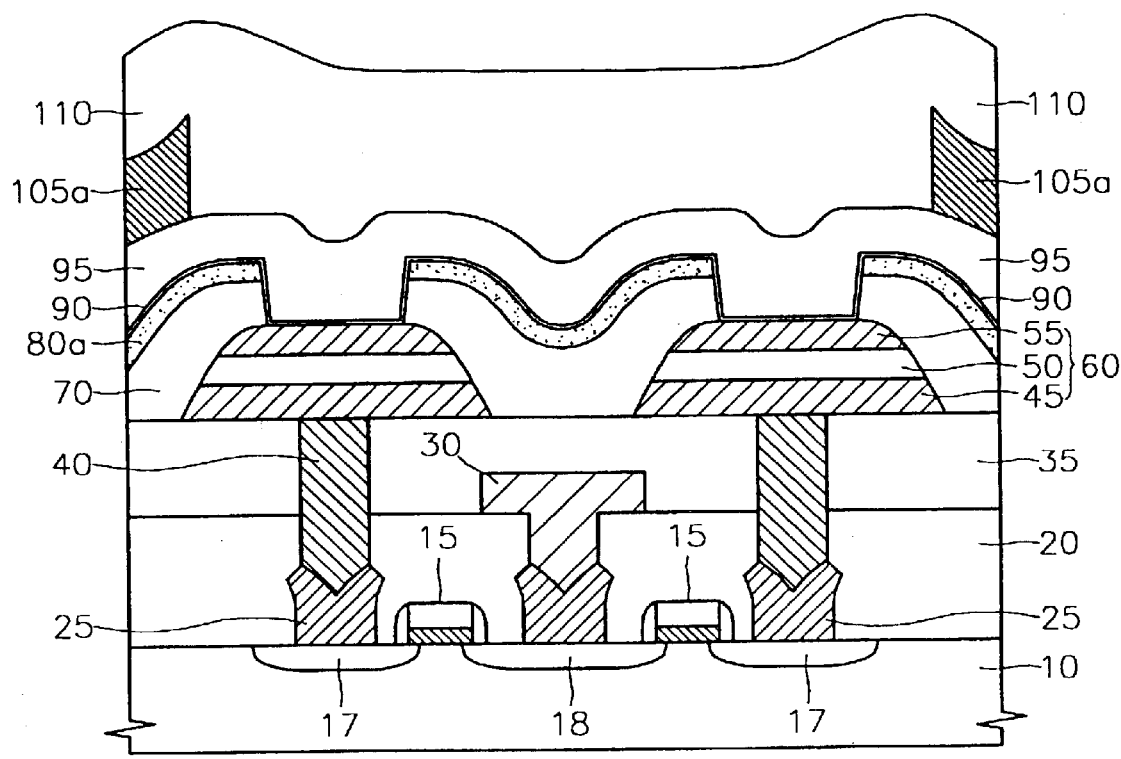

As shown in FIG. 7, a second upper interlayer insulating layer 110 is formed overlying the strapping lines 105a. If the strapping lines 105a and their subsequently formed plate lines are made of metal, the second upper interlayer insulating layer 110 may be an intermetal insulating layer. Preferably, the second upper interlayer insulating layer 110 is made of a material having a different etch selectivity from the patterned via etch-stop layer 80a. Accordingly, like the first upper interlayer insulating layer 95, the second upper interlayer insulating layer 110 can be formed of an oxide layer such as USG, PSG, or PE-TEOS.

Figure 8:
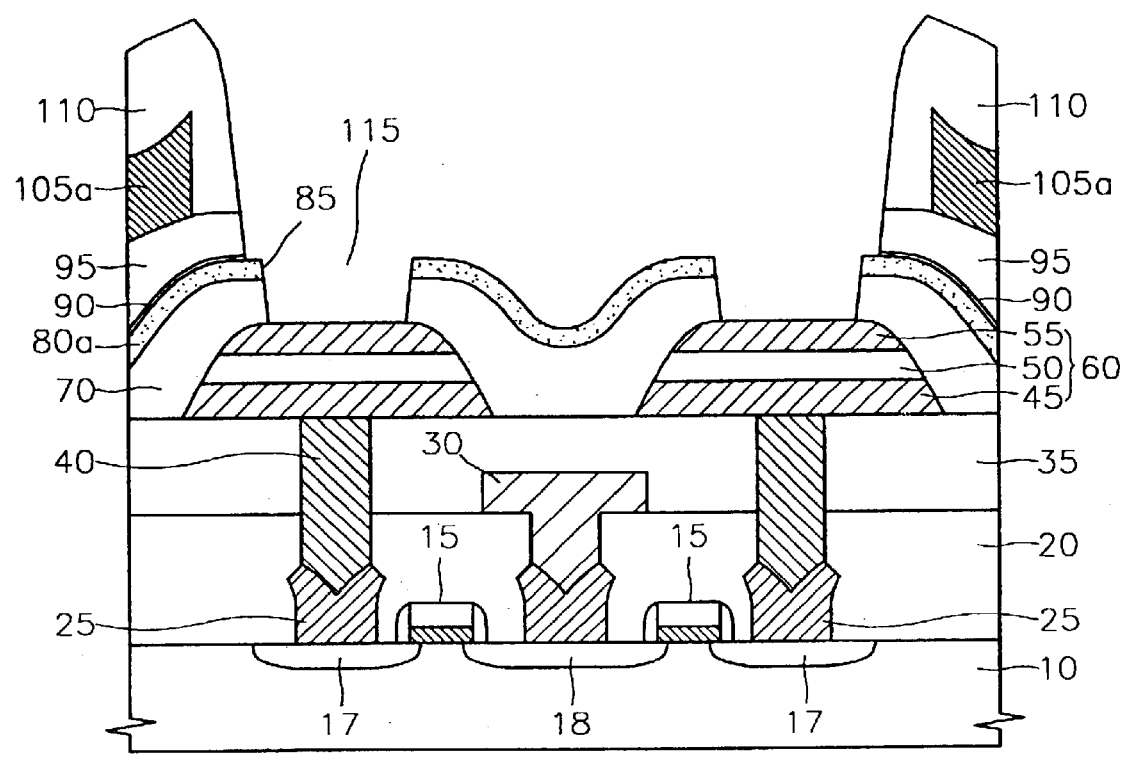

Referring to FIG. 8, the second upper interlayer insulating layer 110 and the first upper interlayer insulating layer 95 are etched to form a common via hole 115, using the patterned via etch-stop layer 80a as an etch end point. The common via hole 115 exposes the upper electrodes 55 of the adjacent capacitors 60. The common via hole 115 is preferably slit-shaped. The slit-shaped common via hole 115 overlaps with the cell via holes 85 therebelow. However, a person skilled in the art will appreciate that other shapes can be also used depending on applications. The slit-shaped common via hole 115 preferably exposes the upper electrodes 55 of at least two adjacent capacitors 60, but more upper electrodes may be exposed.

An encapsulating barrier layer 90, exposed in the above etching process, is also etched. The patterned via etch-stop layer 80a protects the interlayer insulation layer 70 between the ferroelectric capacitors 60 from being etched, because the via etch-stop layer 80 is formed of a material having a different etch selectivity from the interlayer insulating layer 70, the first upper interlayer insulating layer 95, and the second upper interlayer insulating layer 110. Accordingly, etching chemicals do not permeate the ferroelectric layer pattern 50, and the ferroelectric capacitors 60 are not degraded. In the regions without the patterned via etch-stop layer 80a, the second upper interlayer insulating layer 110 and the first upper interlayer insulating layer 95 are etched. Then, the upper electrodes 55 of the ferroelectric capacitors 60 are exposed.

Turning to FIG. 9, plate lines 120 are formed by depositing a conductive layer, for example, a metal such as aluminium, on the resulting structure to form a ferroelectric memory device. The plate lines 120 are electrically connected to the at least two adjacent ferroelectric capacitors 60 via the common via hole 115, and are in contact with the patterned via etch-stop layer 80a between the ferroelectric capacitors 60. Instead of aluminium, the plate lines 120 can be made of any conductive material. When the plate lines 120 are made of aluminium, a CVD or sputtering method can be used. The sputtering method does not require a high-temperature reflow process because it is performed in the wide slit-shaped common via hole 115, so the degradation of characteristics of the ferroelectric capacitors 60 can be avoided.

As described above, when a slit-shaped via hole is formed using the via etch-stop layer as an etch end point according to an embodiment of the present invention, the lower interlayer insulating layer is not damaged. Accordingly, etching chemicals do not expose the ferroelectric layer pattern or lower electrode, so they do not damage the capacitors. Consequently, degradation of remnant polarization or its distribution can be avoided.

FIGS. 10 through 15 are cross-sectional views of a ferroelectric memory device and a method for manufacturing the same according to another embodiment of the present invention. According to this embodiment, cell transistors are disposed on the semiconductor substrate in a two-dimensional array of perpendicular rows and columns. The elements having the same functions as those shown in FIGS. 1 through 9 are denoted by the same reference numerals, and a detailed description thereof will be omitted. The second embodiment is different from the first embodiment in that an interlayer insulation layer is planarized before a via etch-stop layer is formed.

Figure 15:
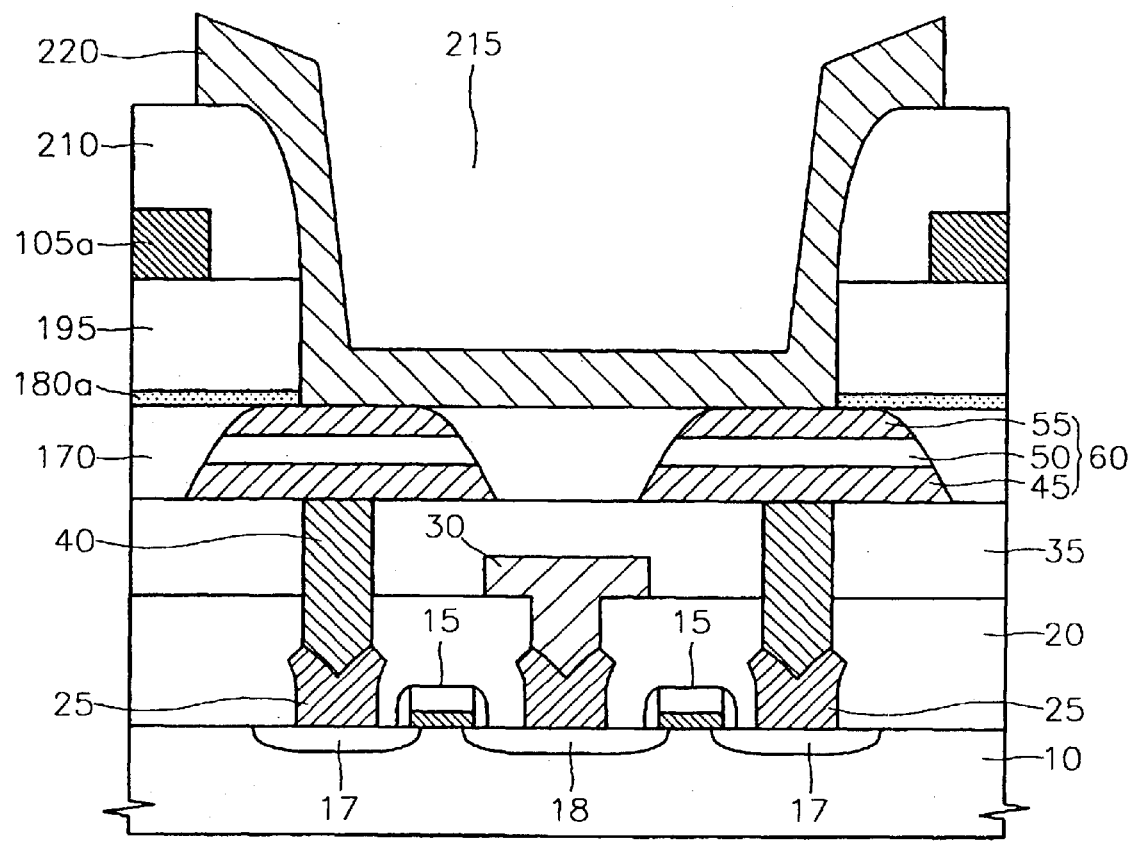

Referring to FIG. 15, which shows the structure of a ferroelectric memory device, the upper electrode 55 of each ferroelectric capacitor 60 is exposed through an interlayer insulation layer 170 that fills the regions between the ferroelectric capacitors 60. Here, the height of the interlayer insulation layer 170 is substantially the same as that of each ferroelectric capacitor 60. A patterned via etch-stop layer 180a is formed on the interlayer insulation layer 170, exposing the interlayer insulation layer 170 between at least two adjacent ferroelectric capacitors 60.

The patterned via etch-stop layer 180a is covered with an upper interlayer insulating layer, which includes a first upper interlayer insulating layer 195 and a second upper interlayer insulating layer 210. The patterned via etch-stop layer 180a is preferably formed of a material having a different etch selectivity from the interlayer insulation layer 170 and the upper interlayer insulating layer. For example, if the interlayer insulation layer 170 and the upper interlayer insulating layer are made of an oxide layer, the patterned via etch-stop layer 180a is preferably made of a titanium oxide layer, an aluminum oxide layer, a silicon nitride layer, a silicon oxynitride layer, or combinations thereof.

The plurality of strapping lines 105a are formed between the first upper interlayer insulating layer 195 and the second upper interlayer insulating layer 210. A plurality of plate lines 220 for a second wiring are preferably formed in direct contact with at least two adjacent ferroelectric capacitors 60 through a slit-shaped common via hole 215 that passes through the second upper interlayer insulating layer 210 and the first upper interlayer insulating layer 195. The plate lines 220 contact the interlayer insulation layer 170 between the ferroelectric capacitors 60.

Although not shown, an encapsulated barrier layer (denoted by reference numeral 90 in FIG. 9) can also be formed between the ferroelectric capacitors 60 and the interlayer insulation layer 170 or within the first and second upper interlayer insulating layers 195 and 210 to prevent permeation of hydrogen.

In this ferroelectric memory device structure, instead of forming a via hole to connect a plate line to a capacitor in each cell, a slit-shaped common vial hole is formed to connect a plate line to a capacitor in each cell, so the ferroelectric memory device can be more highly integrated.

Hereinafter, a method for manufacturing a ferroelectric memory device having the structure shown in FIG. 15 will be described with reference to FIGS. 10 through 14.

Figure 10:
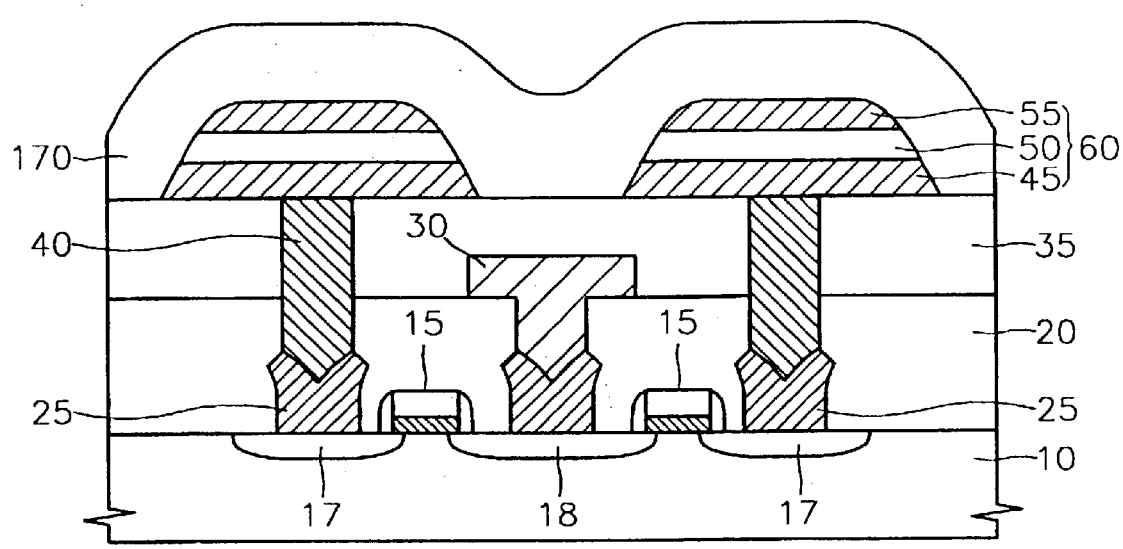
FIGS. 10 through 15 are cross-sectional views of a ferroelectric memory device and a method for manufacturing the same according to another embodiment of the present invention.

As shown in FIG. 10, the process described with reference to FIG. 1 in the first embodiment are performed until the lower electrode layer, the ferroelectric layer and the upper electrode layer are patterned using a mask, to form a plurality of ferroelectric capacitors 60, in which the lower electrode layer 45, the ferroelectric layer pattern 50 and the upper electrode 55 are sequentially stacked. Next, the ferroelectric capacitors 60 are covered with the interlayer insulation layer 170. The interlayer insulation layer 170 can be made of a material such as USG, PSG, or PE-TEOS.

Figure 11:
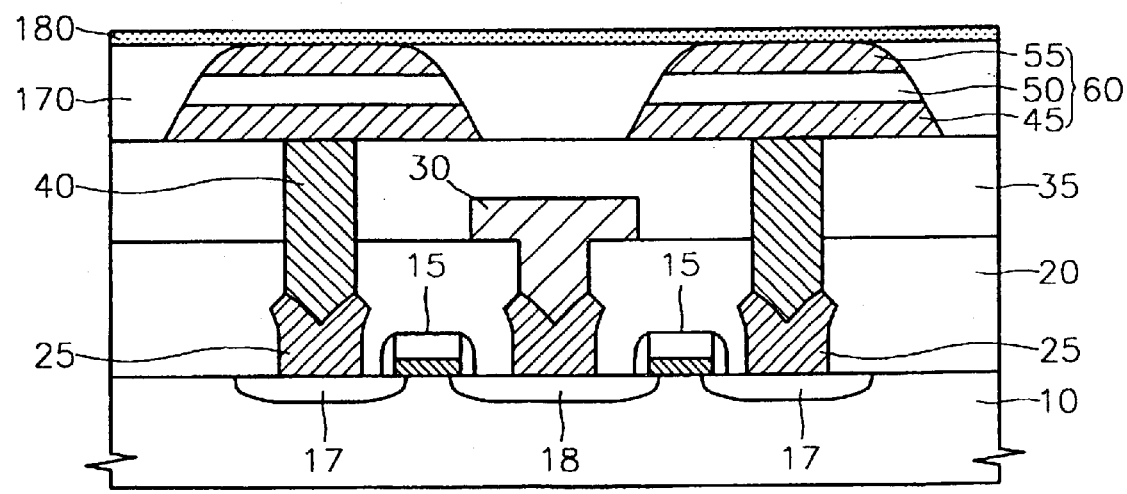

Next, as shown in FIG. 11, the interlayer insulation layer 170 is planarized. The planarization can be performed using etch-back or chemical-mechanical polishing (CMP) until the upper electrodes 55 of the ferroelectric capacitors 60 are exposed, thereby removing the interlayer insulation layer 170 from a top surface of the ferroelectric capacitors 60 and leaving the interlayer insulation layer 170 only in the region between the ferroelectric capacitors 60. Next, a via stop-etch layer 180 is formed on the surface of the semiconductor substrate 10 including the planarized interlayer insulation layer 170. The via etch-stop layer 180 is made of a material having a different etch selectivity from the interlayer insulation layer 170 and comprises, for example, a titanium oxide layer, an aluminum oxide layer, a silicon nitride layer, a silicon oxynitride layer, or combinations thereof When the via etch-stop layer 180 is made of a conductive material, it is necessary to separately form a via etch-stop layer for each cell using photolithography.

Figure 12:
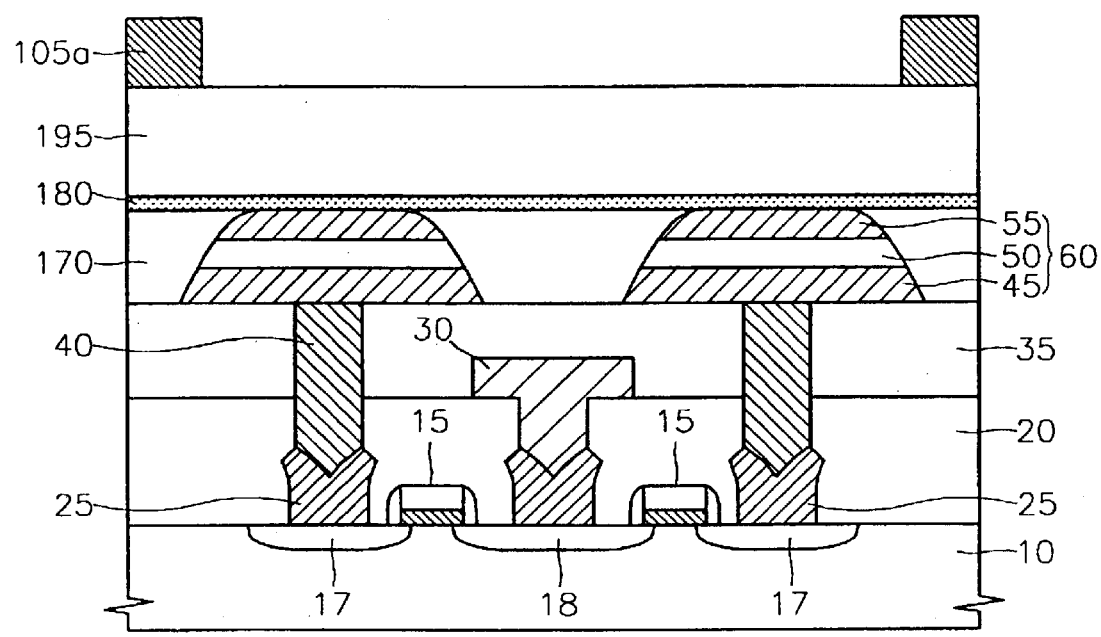

Next, as shown in FIG. 12, the first upper interlayer insulating layer 195 is formed on the via etch-stop layer 180. The first upper interlayer insulating layer 195 is preferably made of a material, for example, USG, PSG, or PE-TEOS, having a different etch selectivity from the via etch-stop layer 180. A conductive layer such as an aluminum layer is formed on the first upper interlayer insulating layer 195 and is then patterned to form the strapping lines 105a.

Figure 13:
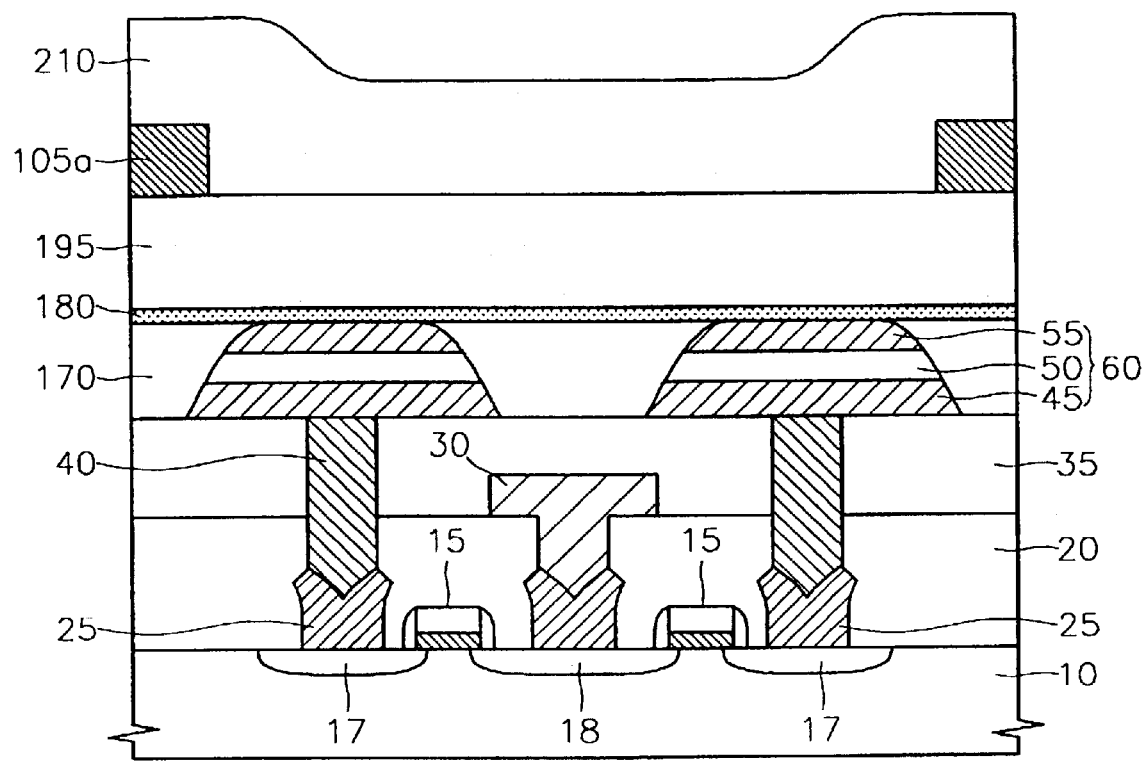

Subsequently, as shown in FIG. 13, the second upper interlayer insulating layer 210 is formed on the resulting structure having the strapping lines 105. The second upper interlayer insulating layer 210 can also be made of USG, PSG, or PE-TEOS.

Figure 14:
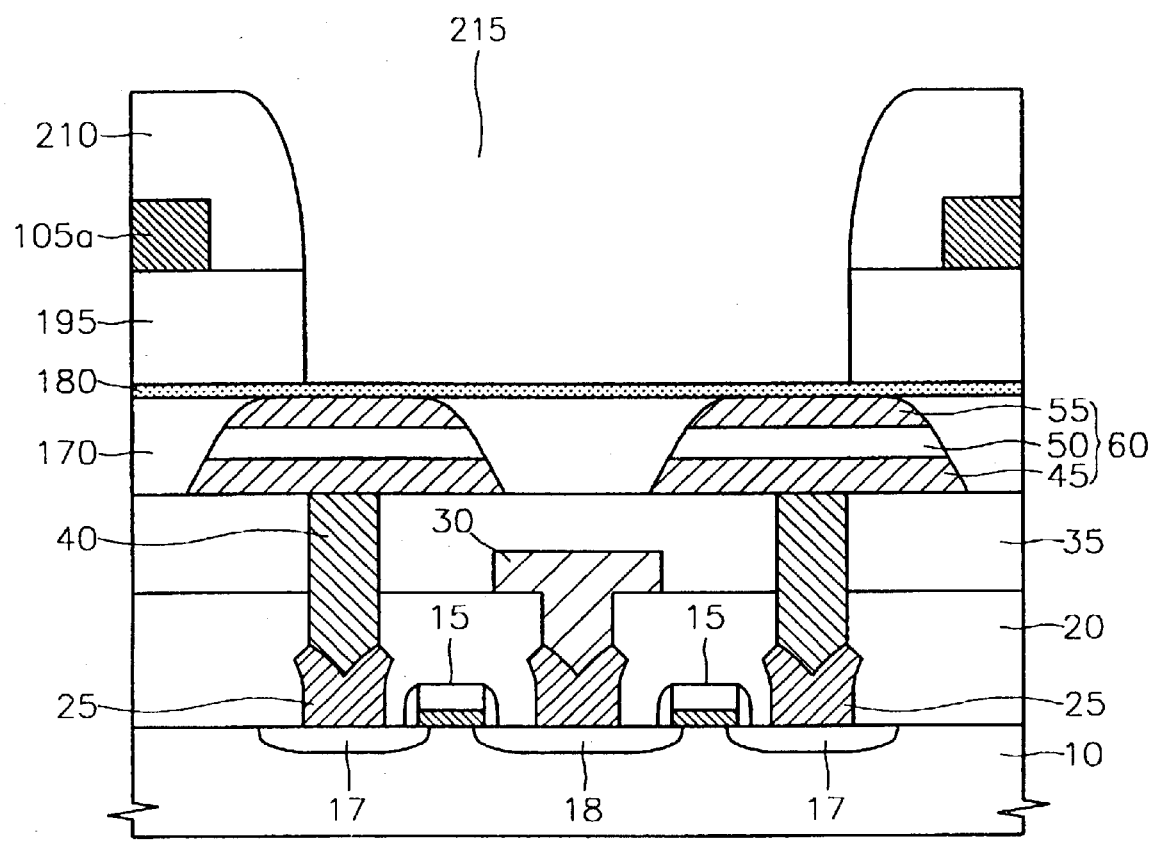

Next, as shown in FIG. 14, the second upper interlayer insulating layer 210 and the first upper interlayer insulating layer 195 are selectively etched to form the slit-shaped common via hole 215, using the via etch-stop layer 180 as an etch end point. The slit shaped common via hole 215 exposes the upper electrodes 55 of the adjacent capacitors 60. The slit-shaped common via hole 215 preferably exposes the upper electrodes 55 of at least two adjacent capacitors 60, but more upper electrodes may be exposed.

The via etch-stop layer 180 protects the interlayer insulation layer 170 between the ferroelectric capacitors 60 from being etched during the formation of the slit-shaped common via hole 215, because the via etch-stop layer 180 is formed using a material having a different etch selectivity from the interlayer insulation layer 170, the first upper interlayer insulating layer 195, and the second upper interlayer insulating layer 210. Accordingly, etching chemicals do not permeate the ferroelectric layer pattern 50, and the ferroelectric capacitors 60 are not degraded.

Referring to FIG. 15, the top surfaces of the ferroelectric capacitors 60 are exposed by removing the via etch-stop layer 180 within the slit-shaped common via hole 215 without etching (damaging) the second upper interlayer insulating layer 210, the first upper interlayer insulating layer 195, and the interlayer insulation layer 170. Then, the plate lines 220 are formed thereon. Thus, when the top surfaces of the ferroelectric capacitors 60 are exposed, the via etch-stop layer 180 is patterned. Reference numeral 180a denotes the patterned via etch-stop layer. The via etch-stop layer 180 can be removed using, for example, an RF sputtering method using argon. Here, the plate lines 220 are electrically connected to the at least two adjacent ferroelectric capacitors 60 via the common via hole 215 and are in contact with the interlayer insulation layer 170 between the ferroelectric capacitors 60.

If the via etch-stop layer 180 does not exist, when the slit-shaped common via hole 215 is formed, the interlayer insulation layer 170 could be excessively recessed, exposing the ferroelectric layer patterns 50. Accordingly, when the plate lines 220 are formed on the resulting structure, the ferroelectric layer patterns 50 are in direct contact with the plate lines 220, thereby significantly degrading ferroelectric characteristics. In other words, when the interlayer insulation layer 170 is excessively etched, the plate lines 220 contact the lower electrodes 45, causing shorts and forming defective ferroelectric memory device.

However, according to an aspect of the present invention, the ferroelectric layer patterns 50 and the lower electrodes 45 can be protected (prevented from being exposed) from etching chemicals during an etching process. Thus, a reliable ferroelectric memory device can be manufactured. In addition, the uniformity of remnant polarization is maintained in each ferroelectric capacitor 60, which overcomes the problem of a reduction of a sensing margin in a ferroelectric memory device.

As described above, when a slit-shaped common via hole is formed using a via etch-stop layer as an etch end point according to the above embodiment of the present invention, the interlayer insulation layer is not damaged. This overcomes the conventional problem where etching chemicals permeate the capacitor dielectric layer and degrade the capacitor characteristics.

It should be noted that the present invention is not limited to the embodiments described above, and it is apparent that variations and modifications can be made by those skilled in the art. For example, each of the plate lines can be connected to at least three neighboring capacitors.

As described above, a plate line and capacitors are connected through a slit-shaped common via hole according to an embodiment of the present invention, improving integration in forming via holes for connection of the plate lines in each cell. According to an embodiment of the present invention, the plate line is in direct contact with the upper electrodes of the at least two adjacent ferroelectric capacitors in a cell array. Accordingly, integration of the ferroelectric memory device is considerably increased. In addition, the reliability of the ferroelectric memory device is significantly improved.

Further, since a via etch-stop layer is used as an etch end point, the lower interlayer insulating layer is not damaged. This overcomes the problem of the prior art, where etching chemicals permeate the capacitor dielectric layer and degrade the capacitor characteristics. Thus, a very reliable capacitor with highly improved characteristics can be manufactured according to embodiments of the present invention.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for manufacturing a ferroelectric memory device, the method comprising:

forming a lower interlayer insulating layer on a semiconductor substrate;

forming at least two adjacent ferroelectric capacitors on the lower interlayer insulating layer;

sequentially forming an interlayer insulation layer and a via etch-stop layer, overlying the ferroelectric capacitors;

patterning the via etch-stop layer and the interlayer insulation layer to form cell via holes that expose a top surface of the ferroelectric capacitors;

forming an upper interlayer insulating layer overlying the patterned via etch-stop layer; and forming a plate line overlying the upper interlayer insulating layer to commonly contact the at least two adjacent ferroelectric capacitors.

2. The method of claim 1, wherein forming an upper interlayer insulating layer comprises:

forming a first upper interlayer insulating layer;

forming strapping lines over the first upper interlayer insulating layer; and forming a second upper interlayer insulating layer covering the strapping lines.

3. The method of claim 2, wherein forming the plate line to commonly contact the at least two adjacent ferroelectric capacitors comprises:

etching the second upper interlayer insulating layer and the first upper interlayer insulating layer using the patterned via etch-stop layer as an etch end point to form a common via hole extending through the second and first upper interlayer insulating layers; and depositing a conductive layer over the second upper interlayer insulating layer to commonly contact the at least two adjacent ferroelectric capacitors through the common via hole.

4. The method of claim 2, wherein the plate line contacts the patterned via etch-stop layer between the at least two adjacent ferroelectric capacitors.

5. The method of claim 2, wherein the via etch-stop layer is made of a material having a different etch selectivity from the interlayer insulation layer, the first upper interlayer insulating layer, and the second upper interlayer insulating layer.

6. The method of claim 2, wherein the interlayer insulation layer, the first and second upper interlayer insulating layers comprise an oxide layer, and the via etch-stop layer is made of a material layer selected from the group consisting of a titanium oxide layer, a silicon nitride layer, a silicon oxynitride layer, an aluminium oxide layer and combinations thereof.

7. The method of claim 2, further comprising forming an encapsulating barrier layer on the patterned via etch-stop layer to deter permeation of hydrogen.

8. The method of claim 7, wherein the encapsulating barrier layer is made of a metallic oxide layer selected from the group consisting of an aluminum oxide layer, a titanium oxide layer, a zirconium oxide layer, a tantalum oxide layer, a silicon nitride layer, a cerium oxide layer and combinations thereof.

9. The method of claim 2, wherein the plate line directly contacts the upper electrodes of at least the two adjacent ferroelectric capacitors, through a slit-shaped common via hole through the first and second upper interlayer insulating layers.

10. The method of claim 2, wherein forming the ferroelectric capacitors comprises:

sequentially forming a lower electrode layer, a ferroelectric layer and an upper electrode layer on the lower interlayer insulating layer; and sequentially patterning the upper electrode layer, the ferroelectric layer and the lower electrode layer to form a plurality of ferroelectric layers, in which the lower electrode, the ferroelectric layer pattern and the upper electrode are sequentially stacked.

11. The method of claim 10, wherein the ferroelectric layer is made of a layer selected from the group consisting of a Pb(Zr, Ti)O$_3$ layer, a SrBi$_2$Ta$_2$O$_9$ layer and SrBi(Ta, Nb)$_2$O$_9$.

12. The method of claim 2, before forming the lower interlayer insulating layer, the method further comprises:

forming a plurality of cell transistors on the substrate of the semiconductor;

forming a first lower interlayer insulating layer on the semiconductor substrate having the plurality of cell transistors;

forming a plurality of bit lines electrically connected to the drain regions of the cell transistors through the first lower interlayer insulating layer;

forming a second lower interlayer insulating layer over the bit lines; and forming a plurality of contact plugs which electrically connect the ferroelectric capacitor and the source regions of the cell transistors through the second lower interlayer insulating layer and the first interlayer insulating layer.

13. A method for manufacturing a ferroelectric memory device, the method comprising:

forming a lower interlayer insulating layer on a semiconductor substrate;

forming at least two adjacent ferroelectric capacitors on the lower interlayer insulating layer;

forming an interlayer insulation layer disposed between the ferroelectric capacitors and extending to substantially the same height as the ferroelectric capacitors, leaving a top surface of the ferroelectric capacitors exposed;

forming a via etch-stop layer on the semiconductor substrate including the interlayer insulation layer;

forming a first upper interlayer insulating layer overlying the via etch-stop layer;

forming strapping lines over the first upper interlayer insulating layer;

forming a second upper interlayer insulating layer covering the strapping lines;

forming a slit-shaped common via hole by selectively etching the second and first upper interlayer insulating layers between the at least two adjacent ferroelectric capacitors using the via etch-stop layer as an etch end point;

exposing the top surface of the ferroelectric capacitors by etching the via etch-stop layer within the slit-shaped common via hole; and forming a plate line by depositing a conductive layer within the slit-shaped common via hole to commonly contact the at least two adjacent ferroelectric capacitors and to contact the interlayer insulation layer between the at least two ferroelectric capacitors.

14. The method of claim 13, wherein the via etch-stop layer is made of a material having a different etch selectivity from the interlayer insulation layer, the first upper interlayer insulating layer, and the second upper interlayer insulating layer.

15. The method of claim 14, wherein the interlayer insulation layer, the first and second upper interlayer insulating layers comprise an oxide layer, and the via etch-stop layer is made of a material layer selected from the group consisting of a titanium oxide layer, a silicon nitride layer, a silicon oxynitride layer, an aluminium oxide layer and combinations thereof.

16. The method of claim 13, wherein the interlayer insulation layer is planarized using an etch-back process or chemical-mechanical polishing process.

17. The method of claim 13, further comprising forming an encapsulating barrier layer between the ferroelectric capacitors and the first and second upper interlayer insulating layer or within the interlayer insulation layer to prevent permeation of hydrogen.

* * * * *